(12) United States Patent
Ivanov et al.

(10) Patent No.: US 7,922,881 B2
(45) Date of Patent: Apr. 12, 2011

(54) SPUTTERING TARGET WITH AN INSULATING RING AND A GAP BETWEEN THE RING AND THE TARGET

(75) Inventors: Eugene Y. Ivanov, Grove City, OH (US); Erich Theado, Columbus, OH (US); Harry W. Conard, Orient, OH (US); John E. Poole, Grove City, OH (US)

(73) Assignee: Tosoh SMD, Inc., Grove City, OH (US)

( * ) Notice: Subject to any disclaimer, the term of this patent is extended or adjusted under 35 U.S.C. 154(b) by 886 days.

(21) Appl. No.: 11/884,799

(22) PCT Filed: Feb. 28, 2006

(86) PCT No.: PCT/US2006/007062
§ 371 (c)(1),
(2), (4) Date: Aug. 21, 2007

(87) PCT Pub. No.: WO2006/093953
PCT Pub. Date: Sep. 8, 2006

(65) Prior Publication Data
US 2008/0164146 A1    Jul. 10, 2008

Related U.S. Application Data

(60) Provisional application No. 60/656,966, filed on Feb. 28, 2005.

(51) Int. Cl.
*C25B 9/00* (2006.01)
*C25B 11/00* (2006.01)
*C25B 13/00* (2006.01)
*C23C 14/00* (2006.01)

(52) U.S. Cl. .................. 204/298.12; 204/298.21

(58) Field of Classification Search ............. 204/298.12, 204/298.21
See application file for complete search history.

(56) References Cited

U.S. PATENT DOCUMENTS
5,690,795 A    11/1997   Rosenstein et al.
(Continued)

FOREIGN PATENT DOCUMENTS
GB    2 255 105 A    10/1992
(Continued)

*Primary Examiner* — Alexa D Neckel
*Assistant Examiner* — Michael Band
(74) *Attorney, Agent, or Firm* — Wegman, Hessler & Vanderburg

(57) ABSTRACT

A sputtering plasma reactors for plasma vapor deposition (PVD) having an improved interface between a PVD target, a ceramic ring and a PVD chamber wall. The reactor includes a PVD chamber wall and a PVD target, wherein the target in conjunction with the PVD chamber wall form a vacuum chamber and wherein at least the portion of the target facing the vacuum chamber is composed of material to be sputtered. The reactor also includes an insulating ceramic ring positioned between the target and the PVD chamber wall. A first O-ring is provided to establish a vacuum seal between the target and the insulating ring and a second O-ring is provided to establish a vacuum seal between the insulating ring and the PVD chamber wall. At least one spacer is positioned between the target and insulating ring to maintain a gap G between the insulating ring and the target. The spacer is made of a suitable low coefficient of friction material and inhibits black marking, scratching or the like that may otherwise occur along the interface between the ceramic ring and the target.

8 Claims, 6 Drawing Sheets

U.S. PATENT DOCUMENTS

| | | |
|---|---|---|
| 5,736,021 A | 4/1998 | Ding et al. |
| 5,879,523 A | 3/1999 | Wang et al. |
| 5,935,397 A * | 8/1999 | Masterson ............... 204/298.12 |
| 6,039,848 A | 3/2000 | Moslehi et al. |
| 6,093,654 A | 7/2000 | Koyama |
| 6,214,184 B1 | 4/2001 | Chien et al. |
| 6,258,223 B1 | 7/2001 | Cheung et al. |
| 6,287,435 B1 | 9/2001 | Drewery et al. |
| 6,297,595 B1 | 10/2001 | Stimson et al. |
| 6,298,685 B1 | 10/2001 | Tepman |
| 6,398,929 B1 | 6/2002 | Chiang et al. |
| 6,413,383 B1 | 7/2002 | Chiang et al. |
| 6,582,569 B1 | 6/2003 | Chiang et al. |
| 6,719,886 B2 | 4/2004 | Drewery et al. |
| 6,723,214 B2 | 4/2004 | Stimson et al. |
| 2001/0019016 A1 | 9/2001 | Subramani et al. |

FOREIGN PATENT DOCUMENTS

| | | |
|---|---|---|
| GB | 2 330 591 A | 4/1999 |
| JP | 63083257 | 4/1988 |
| WO | WO 98/37568 | 8/1998 |
| WO | WO 2005/007924 A1 | 1/2005 |

* cited by examiner

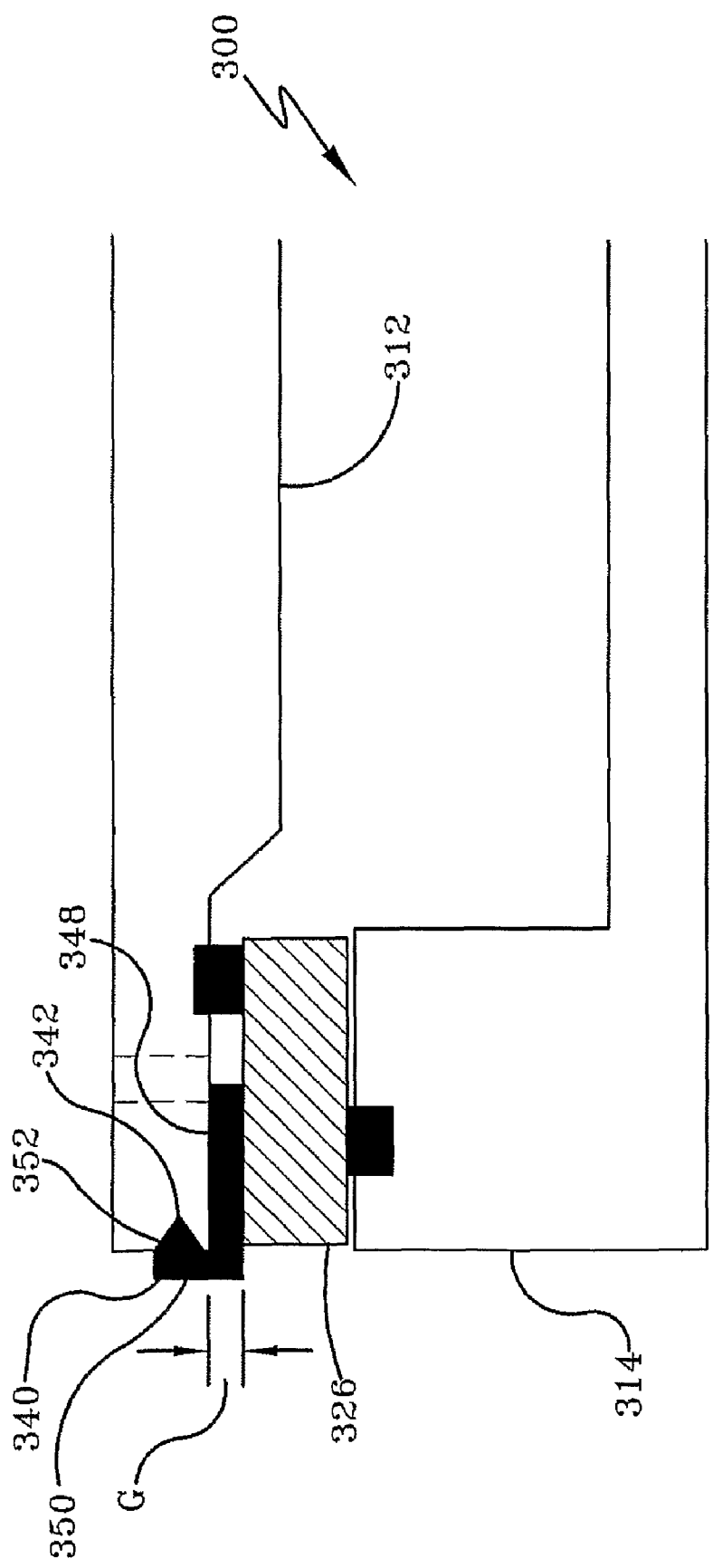

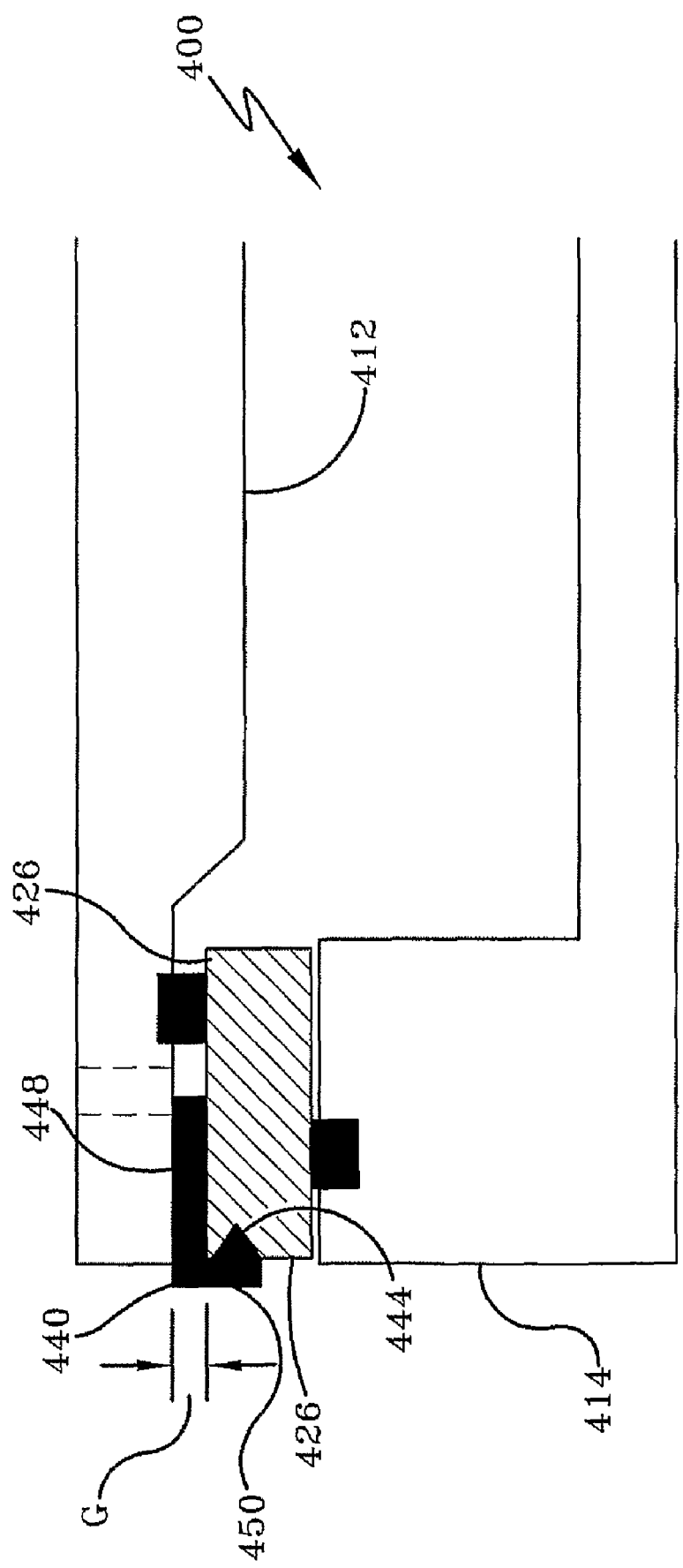

SPUTTERING TARGET WITH AN INSULATING RING AND A GAP BETWEEN THE RING AND THE TARGET

CROSS REFERENCE TO RELATED APPLICATION

The present application claims priority under 35 U.S.C. §119(e) to U.S. Provisional Patent Application No. 60/656,966, filed Feb. 28, 2005.

BACKGROUND OF THE INVENTION

1. Field of the Invention

The present invention is related to sputtering plasma reactors for plasma vapor deposition (PVD), and more particularly, to an improved interface between a PVD target, a ceramic ring and a PVD chamber wall in the plasma reactor.

2. Description of Related Art

In modern fabrication of semiconductor integrated circuits, metals are typically deposited by physical vapor deposition (PVD) utilizing a plasma reactor. This deposition process is performed in a plasma reactor 10 illustrated in the schematic cross section in FIG. 1. The reactor 10 includes a target 12, which in conjunction with a PVD chamber wall 14 and other sealing members, forms a vacuum chamber 16. The target 12 is fixed to a target backing plate 18, behind which are located unillustrated scanning magnets and the chamber cover. At least the portion of the target 12 facing the central portion of the vacuum chamber 16 is composed of the material to be sputtered, which can be, for example, aluminum. A substrate whose surface is to be sputter deposited is supported on a pedestal (not shown) positioned in opposition to the target 12.

An insulating ring 26 between the target 12 and the PVD chamber wall 14 allow their differential biasing. The insulating ring 26 is desirably made of a ceramic material. A first O-ring 28 establishes a vacuum seal between the target 12 and the insulating ring 26 while a second O-ring 30 maintains the vacuum seal between the insulating ring 26 and an adapter ring 32 of the PVD chamber wall 14.

A gas supply system (not shown) supplies a controlled flow of various gases into the vacuum chamber 16 while a vacuum pump maintains a vacuum level at a fixed gas flow. The vacuum chamber 16 is filled with argon or other non-reactive gas to a reduced pressure. Note however that in some applications a reactive gas is additionally filled into the chamber to effect reactive sputtering. The conductive chamber wall 14, usually made of aluminum or stainless steel, is generally grounded while a DC power supply 24 applies a negative voltage of about −500V to the target 12.

The electrical bias causes the argon to discharge and form a plasma of positively charged argon ions and negatively charged electrons in the space between the target 12 and the substrate. The argon ions are electrically attracted to the negatively charged target 12 and, strike it at high enough energy to sputter target particles from the target 12. To promote uniform erosion of the target 12, a magnetron may be provided above the target. However, in some applications the magnetron might be omitted by increasing the energetic electron injection ionization of the high density electron cloud 900. A DC power setting for biasing the target 12 of 3 kW is preferred but a range of 2-5 kW and a pedestal bias voltage of −30 volts DC is believed to be satisfactory for many applications. The sputtered material travels ballistically, generally omni-directionally, and some fraction hit the substrate 20 to be deposited thereon as a thin film.

Current designs typically have the target 12 making direct contact with the insulating ring 26 located between the PVD chamber wall 14 and the target. Direct contact of the target 12 with the insulating ring 26 can cause visible scratches and black marking to occur on the target during the sputtering process. As a result, the target 12 needs to be periodically reconditioned.

SUMMARY OF THE INVENTION

One aspect of the invention is directed to sputtering plasma reactors for plasma vapor deposition (PVD). The reactor includes a PVD chamber wall and a PVD target, wherein the target in conjunction with the PVD chamber wall form a vacuum chamber and wherein at least the portion of the target facing the vacuum chamber is composed of material to be sputtered. The reactor also includes an insulating ceramic ring positioned between the target and the PVD chamber wall. A first O-ring is provided to establish a vacuum seal between the target 12 and the insulating ring and a second O-ring is provided to establish a vacuum seal between the insulating ring and the PVD chamber wall. At least one spacer is positioned between the target and insulating ring to maintain a gap G between the insulating ring and the target. The spacer is made of a suitable low coefficient of friction material and inhibits black marking, scratching or the like that may otherwise occur along the interface between the ceramic ring and the target.

BRIEF DESCRIPTION OF THE DRAWINGS

The above mentioned and other features of this invention will become more apparent and the invention itself will be better understood by reference to the following description of embodiments of the invention taken in conjunction with the accompanying drawings, wherein:

FIG. 3 is a schematic cross section of the plasma reactor with an alternate embodiment of the spacer;

FIG. 4 is a schematic cross section of the plasma reactor with another alternate embodiment of the spacer.

Corresponding reference characters indicate corresponding parts throughout the views of the drawings.

DETAILED DESCRIPTION OF EXEMPLARY EMBODIMENTS

The invention will now be described in the following detailed description with reference to the drawings, wherein preferred embodiments are described in detail to enable practice of the invention. Although the invention is described with reference to these specific preferred embodiments, it will be understood that the invention is not limited to these preferred embodiments. But to the contrary, the invention includes numerous alternatives, modifications and equivalents as will become apparent from consideration of the following detailed description.

Figure 1:
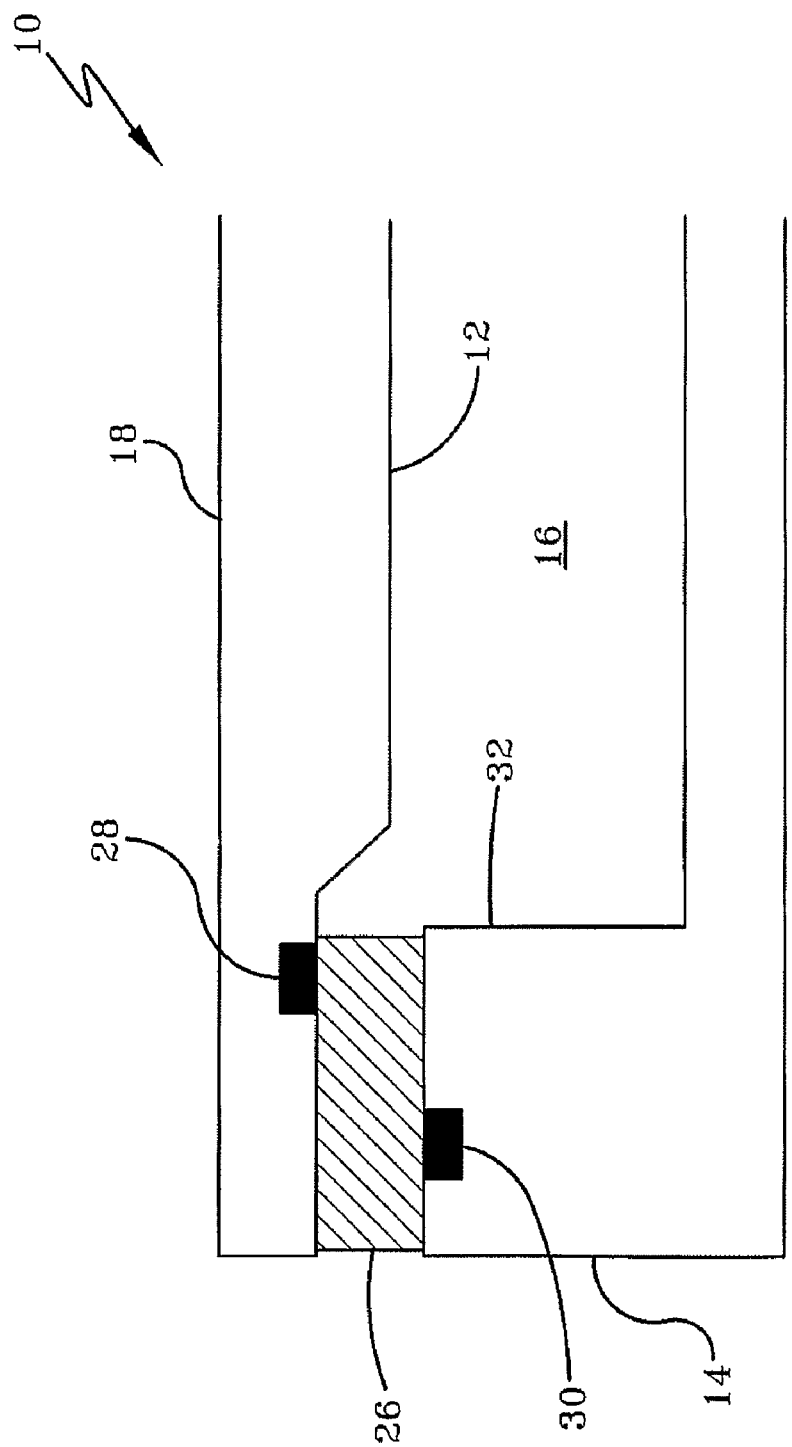
FIG. 1 is a schematic cross section of a prior art plasma reactor.
Figure 2A:
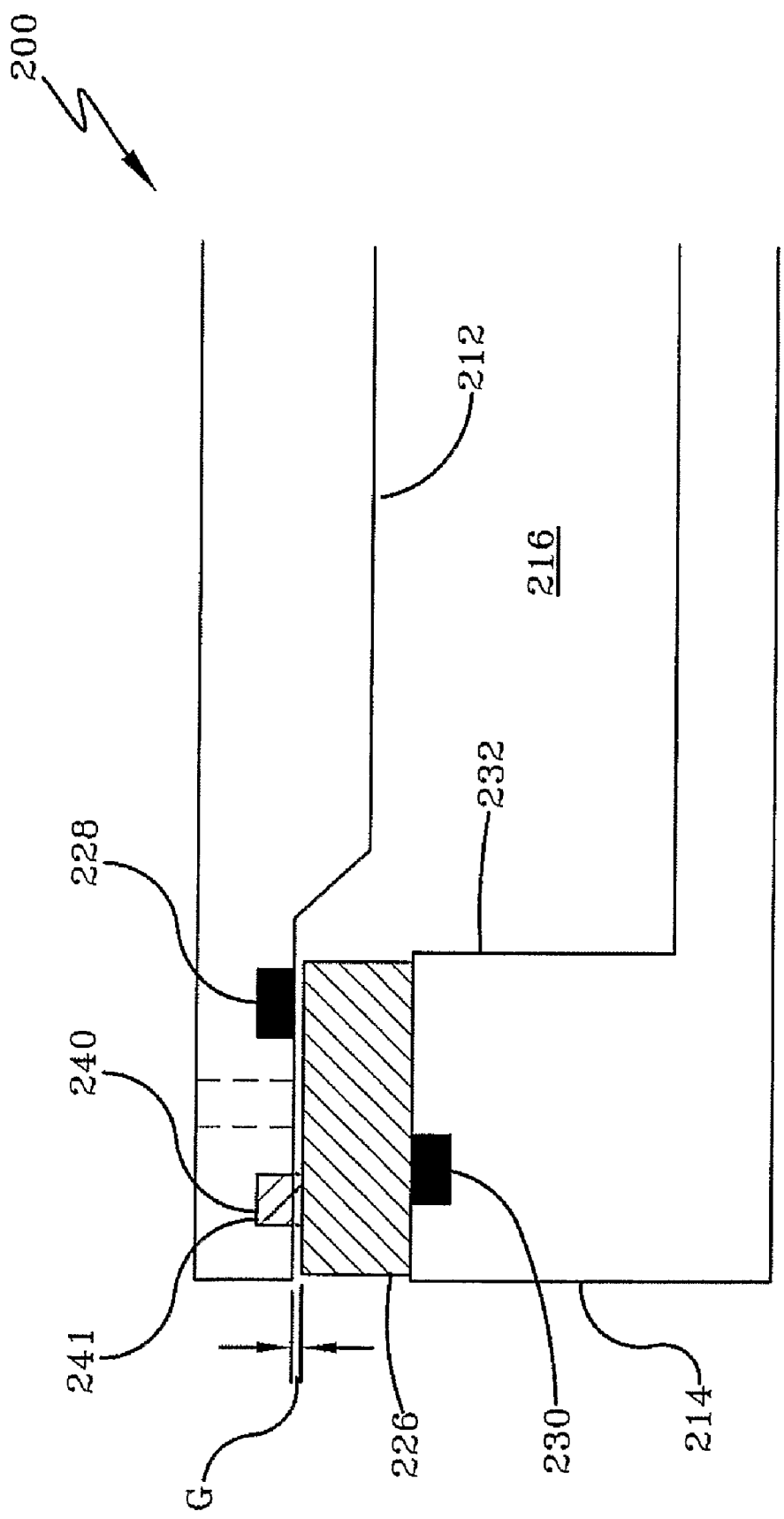
FIG. 2A is a schematic cross section of a plasma reactor having a spacer forming a gap between the target and the ceramic ring of the plasma reactor.

FIG. 2A illustrates a cross sectional view of a portion of a PVD plasma reactor 200 incorporating one embodiment of the invention. The reactor 200 includes a target 212, which in conjunction with a PVD chamber wall 214 and other conventional sealing members, forms a vacuum chamber 216. The target 212 is desirably generally disk-shaped. A substrate (not shown) whose surface is to be sputter deposited is supported on a pedestal (not shown) positioned in opposition to the target 212 in a known configuration. The spacing between the substrate to be sputtered and the target 212 is preferably about 140 mm, but can range from about 80 mm to about 200 mm (about 3 inches to about 8 inches).

The target 212 is separated from the PVD chamber wall 214 with an insulating ring 226. The insulating ring 226, which may be made of a variety of insulative materials, including ceramics, spaces the target 212 from the PVD chamber wall 214 so that the target 212 may be adequately negatively biased. A first O-ring 228 establishes a vacuum seal between the target 212 and the insulating ring 226 while a second O-ring 230 maintains the vacuum seal between the insulating ring 226 and an adapter ring 232 of the PVD chamber wall 214 to provide a vacuum tight assembly for the vacuum chamber 216.

According to the invention, a gap G is maintained between the insulating ring 226 and the target 212 by inserting at least one spacer 240 between the target and insulating ring. In one embodiment, the spacer 240 comprises a number of pressure pads located around the outer circumference of the target 212. Each pressure pad 240 is partially received in a counter bore hole 241 formed in the flange of the target. Desirably, the pressure pads are made of Teflon brand polytetrafluoroethylene. However, other plastic materials may be used without departing from the scope of the invention. Use of the Teflon brand polytetrafluoroethylene or similar low coefficient of friction material will inhibit black marking, scratching and the like that may otherwise occur along the interface between the ceramic ring 226 and the target 212.

Figure 2B:
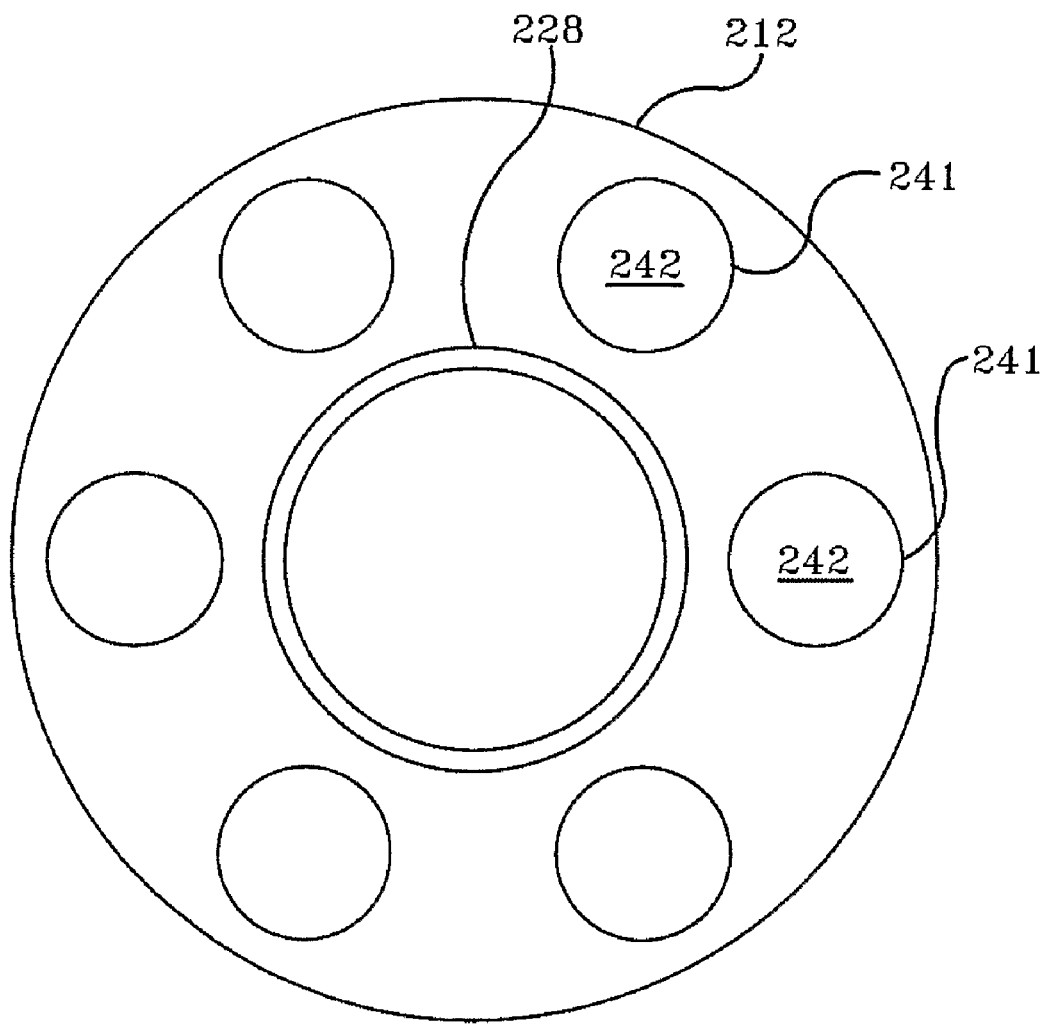
FIG. 2B is a schematic plan view of the plasma reactor of FIG. 2A.

As best seen in FIG. 2B, a plurality of counter bore holes 241 are located in the target 212 in a generally circular pattern radially outside of the o-ring 228 and near the outer circumference of the target 212. In the illustrated embodiment, the pressure pads 240 are generally cylindrical in shape and configured to snuggly fit within the bore holes 241. Desirably, there are between about 4 and 30 pressure pads around the circumference of the target, and more preferably, between about 10 and about 20 pressure pads. In one preferred embodiment, the pressure pads 240 have a diameter of about 0.228 inches (5.79 mm) and are about 0.130 (3.30 mm) inches tall, although other dimensions may be used without departing from the scope of the invention. In the embodiment using the above-sized pressure pads, the counter bore holes 242 formed in the target 212 are desirably about 0.115 inches (2.92 mm) deep. This gives the pressure pads 240 about a 0.015 inch (0.381 mm) clearance above the surface of the outer flange of the target 212. The clearance forms the gap G thereby substantially preventing the target 212 from contacting the insulating ring 226. Alternately, the spacer 240 can be an annular ring received in a groove in the target 212. Additionally, although not specifically illustrated, one skilled in the art will understand that spacer 240 can likewise be inserted between the insulating ring 226 and the adapter portion 232 of the PVD chamber wall 214 and that the spacer 240 may be inserted into counter bore holes in the insulating ring instead of the target as in the illustrated embodiment.

FIG. 3 illustrates a reactor 300 with a gap G formed between target 312 and insulating ring 326 using another embodiment of spacer 340. In this embodiment, the spacer 340 comprises a spacer that is received between the target 312 and insulating ring 326 and snaps into a groove 342 on the outer circumference of the target 312. The spacer 340 may be an annular ring or may be formed by a plurality of individual spacers located around the circumference of the target as with the pressure pads described with reference to FIGS. 2A and 2B. FIG. 4 illustrates yet another embodiment where spacer 440 snaps over the insulating ring 426 and into a groove 444 on the outer circumference of the insulating ring.

In the embodiments illustrated in FIGS. 3 and 4, the spacers desirably have tongue portions 348, 448 inserted between the target 312, 412 and insulating ring 326, 426 having a width of between about 0.010 inches (0.25 mm) and 0.020 inches (0.50 mm) to form the gap G. An arm 350, 450 extends from the tongue 348, 448 and has a post 352, 452 that is received in grooves 342, 444 by frictional fit to secure the spacer 340, 440.

Figure 5:
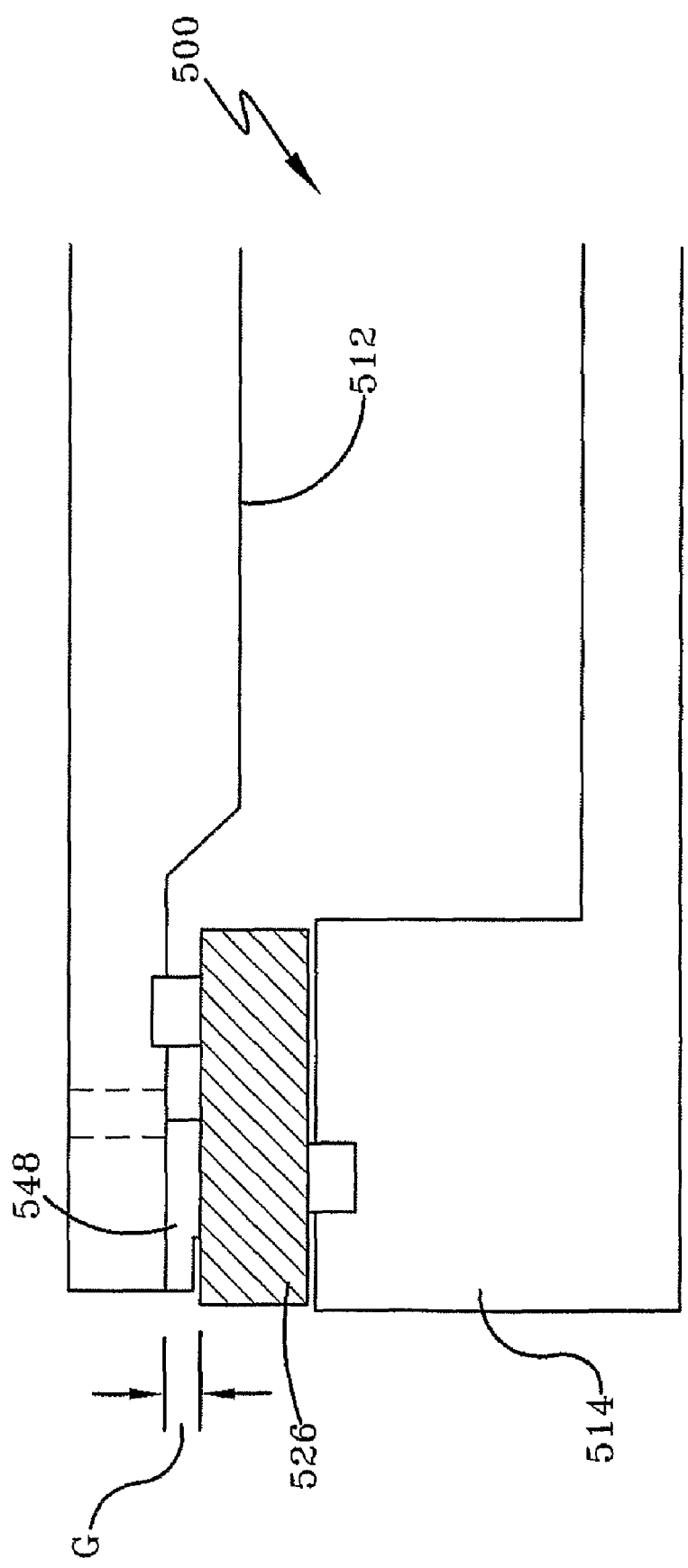
FIG. 5 is a schematic cross section of the plasma reactor with another alternate embodiment of the spacer.

FIG. 5 illustrates yet another embodiment of a spacer 540 used to form a gap G between a target 512 and the corresponding insulating ring 526. In this embodiment, the spacer 540 is a coating or tape applied to the target 512 with an adhesive.

While this invention has been described in conjunction with the specific embodiments described above, it is evident that many alternatives, combinations, modifications and variations are apparent to those skilled in the art. Accordingly, the preferred embodiments of this invention, as set forth above are intended to be illustrative only, and not in a limiting sense. Various changes can be made without departing from the spirit and scope of this invention.

What is claimed is:

1. A sputtering plasma reactor for plasma vapor deposition (PVD), the reactor comprising:
   a PVD chamber wall;
   a PVD target, wherein the target and the PVD chamber wall form a vacuum chamber, and wherein at least the portion of the target facing said vacuum chamber is composed of material to be sputtered;
   an insulating ring positioned between the target and the PVD chamber wall;
   a first O-ring provided to establish a vacuum seal between the target and the insulating ring;
   a second O-ring provided to establish a vacuum seal between the insulating ring and the PVD chamber wall; and
   at least one spacer positioned between the target and the insulating ring to maintain a gap between the insulating ring and the target, wherein the spacer comprises a plurality of pressure pads located around the outer circumference of the target, wherein each pressure pad is partially received in a counter bore formed in an outer flange of the target.

2. The sputtering plasma reactor of claim 1 wherein the pressure pads are located in the target in a generally circular pattern radially outside the first O-ring.

3. The sputtering plasma reactor of claim 1 wherein the pressure pads are made of Teflon.

4. The sputtering plasma reactor of claim 1 wherein pressure pads are cylindrical in shape and configured to snuggly fit within the bore holes.

5. The sputtering plasma reactor of claim 4 wherein the pressure pads extend about 0.015 inch (about 0.38 mm) above the surface of the target to form the gap thereby substantially preventing the target from contacting the insulating ring.

6. The sputtering plasma reactor of claim 1 wherein the spacer comprises between about 10 and about 20 pressure pads.

7. The sputtering plasma reactor of claim 1 wherein the insulating ring enables differential biasing of the target and chamber wall.

8. The sputtering plasma reactor of claim 1 wherein the insulating ring is made of a ceramic material.

* * * * *